United States Patent
Mizumata et al.

(10) Patent No.: US 11,189,315 B2
(45) Date of Patent: Nov. 30, 2021

(54) AUDIO PROCESSING DEVICE

(71) Applicant: Panasonic Intellectual Property Management Co., Ltd., Osaka (JP)

(72) Inventors: Naohiro Mizumata, Hyogo (JP); Masami Yamamoto, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/967,697

(22) PCT Filed: Oct. 15, 2018

(86) PCT No.: PCT/JP2018/038325
§ 371 (c)(1),
(2) Date: Aug. 5, 2020

(87) PCT Pub. No.: WO2019/187267
PCT Pub. Date: Oct. 3, 2019

(65) Prior Publication Data
US 2021/0035605 A1   Feb. 4, 2021

(30) Foreign Application Priority Data

Mar. 28, 2018   (JP) .............................. JP2018-062959

(51) Int. Cl.
*G11B 7/00* (2006.01)
*G11B 7/005* (2006.01)
(Continued)

(52) U.S. Cl.
CPC .............. *G11B 7/005* (2013.01); *G11B 20/10* (2013.01); *H03G 3/3005* (2013.01)

(58) Field of Classification Search
None
See application file for complete search history.

(56) References Cited

U.S. PATENT DOCUMENTS 5,502,700 A * 3/1996 Shinada ................ G11B 19/00
                                                     369/47.11
5,699,336 A   12/1997 Maeda et al.
(Continued)

FOREIGN PATENT DOCUMENTS

JP   S61-208668 A   9/1986
JP   S63-190518 A   8/1988
(Continued)

OTHER PUBLICATIONS

International Search Report issued in corresponding International Patent Application No. PCT/JP2018/038325, dated Nov. 6, 2018, with English translation.

*Primary Examiner* — Peter Vincent Agustin
(74) *Attorney, Agent, or Firm* — McDermott Will & Emery LLP (57) ABSTRACT

An audio processing device includes: a drive circuit; a signal processing circuit; a power supply circuit; a power storage; a switch that selectively switches connection of the drive circuit between the power storage and the power supply circuit; and a controller that causes the switch to connect the drive circuit and the power supply circuit when the drive circuit is to be in a first state, and causes the switch to connect the drive circuit and the power storage when the drive circuit enters a second state. The first state is a state where current consumption of the drive circuit is greater than or equal to a predetermined threshold. The second state is a state where the current consumption of the drive circuit is less than the predetermined threshold.

8 Claims, 3 Drawing Sheets

(51) Int. Cl.
*G11B 20/10* (2006.01)
*H03G 3/30* (2006.01)

(56) References Cited

U.S. PATENT DOCUMENTS

| | | | | |
|---|---|---|---|---|
| 6,624,962 | B1* | 9/2003 | Kodama | G11B 19/00 360/75 |
| 7,092,613 | B1* | 8/2006 | Ide | G11B 19/04 348/333.13 |
| 2007/0047925 | A1 | 3/2007 | Araki | |
| 2007/0195661 | A1* | 8/2007 | Raaymakers | G11B 19/00 369/44.32 |
| 2013/0021096 | A1 | 1/2013 | Sugawara et al. | |
| 2014/0029401 | A1* | 1/2014 | Sakata | H04N 5/775 369/47.16 |
| 2016/0197683 | A1 | 7/2016 | Yu | |
| 2021/0035605 | A1* | 2/2021 | Mizumata | G11B 31/00 |

FOREIGN PATENT DOCUMENTS

| | | |
|---|---|---|
| JP | H01-109825 U | 7/1989 |
| JP | 2011-188447 A | 9/2011 |
| JP | 2012-133855 A | 7/2012 |

\* cited by examiner

AUDIO PROCESSING DEVICE

CROSS-REFERENCE OF RELATED APPLICATIONS

This application is the U.S. National Phase under 35 U.S.C. § 371 of International Patent Application No. PCT/JP2018/038325, filed on Oct. 15, 2018, which in turn claims the benefit of Japanese Application No. 2018-062959, filed on Mar. 28, 2018, the entire disclosures of which Applications are incorporated by reference herein.

TECHNICAL FIELD

The present disclosure relates to an audio processing device.

BACKGROUND ART

Conventionally, optical discs such as a compact disc (CD), super audio CD (SACD), digital versatile disc (DVD), and Blu-lay (a registered trademark) disc (BD) have been used as a recording medium capable of recording and reproducing audio contents. Generally, an audio processing device that processes audio signals recorded on an optical disc obtains audio signals by spinning the optical disc at a predetermined speed using a spindle motor, and causing the optical pickup to follow a record track of the optical disc using a servomechanism. For example, Patent Literature (PTL) 1 discloses a technique related to such an audio processing device.

CITATION LIST

Patent Literature

PTL 1: Japanese Unexamined Patent Application Publication No. 61-208668

SUMMARY OF THE INVENTION

Technical Problem

In PTL 1, a common power supply is used to supply power to a drive circuit for driving an actuator, such as a spindle motor and servomechanism, and to supply power to a signal processing circuit that processes an audio signal. Thus, noise that occurs due to change in current at a time of driving the actuator affects the signal processing circuit that shares the power supply with the drive circuit, thereby degrading the audio quality.

In view of the above, the present disclosure provides an audio processing device that suppresses degradation in audio quality.

Solution to Problem

The audio processing device according to one aspect of the present disclosure includes: a drive circuit that drives an actuator for use in obtaining an audio signal from a recording medium; a signal processing circuit that processes the audio signal obtained; a power supply circuit that supplies, to at least the signal processing circuit, power inputted from an external source; a power storage for supplying stored power to the drive circuit; a switch that selectively switches connection of the drive circuit between the power storage and the power supply circuit; and a controller that causes the switch to connect the drive circuit and the power supply circuit when the drive circuit is to be in a first state, and causes the switch to connect the drive circuit and the power storage when the drive circuit enters a second state. The first state is a state in which current consumption of the drive circuit is greater than or equal to a predetermined threshold, and the second state is a state in which the current consumption of the drive circuit is less than the predetermined threshold.

Advantageous Effect of Invention

The audio processing device according to the present disclosure is capable of suppressing degradation in audio quality.

DESCRIPTION OF EXEMPLARY EMBODIMENTS

Embodiments will be described in detail below with reference to the drawings appropriately. However, unnecessarily detailed description may be omitted. For example, detailed description of well-known matters or repeated description of essentially similar structures may be omitted. This is to avoid unnecessary redundancy and facilitate the understanding of those skilled in the art.

It should be noted that the inventors have provided the accompanying drawings and following description in order to facilitate sufficient understanding of the present disclosure by those skilled in the art, and thus are not intended to limit the subject matter of the claims.

Embodiment 1

Hereinafter, Embodiment 1 will be described with reference to FIG. 1 and FIG. 2.

Figure 1:
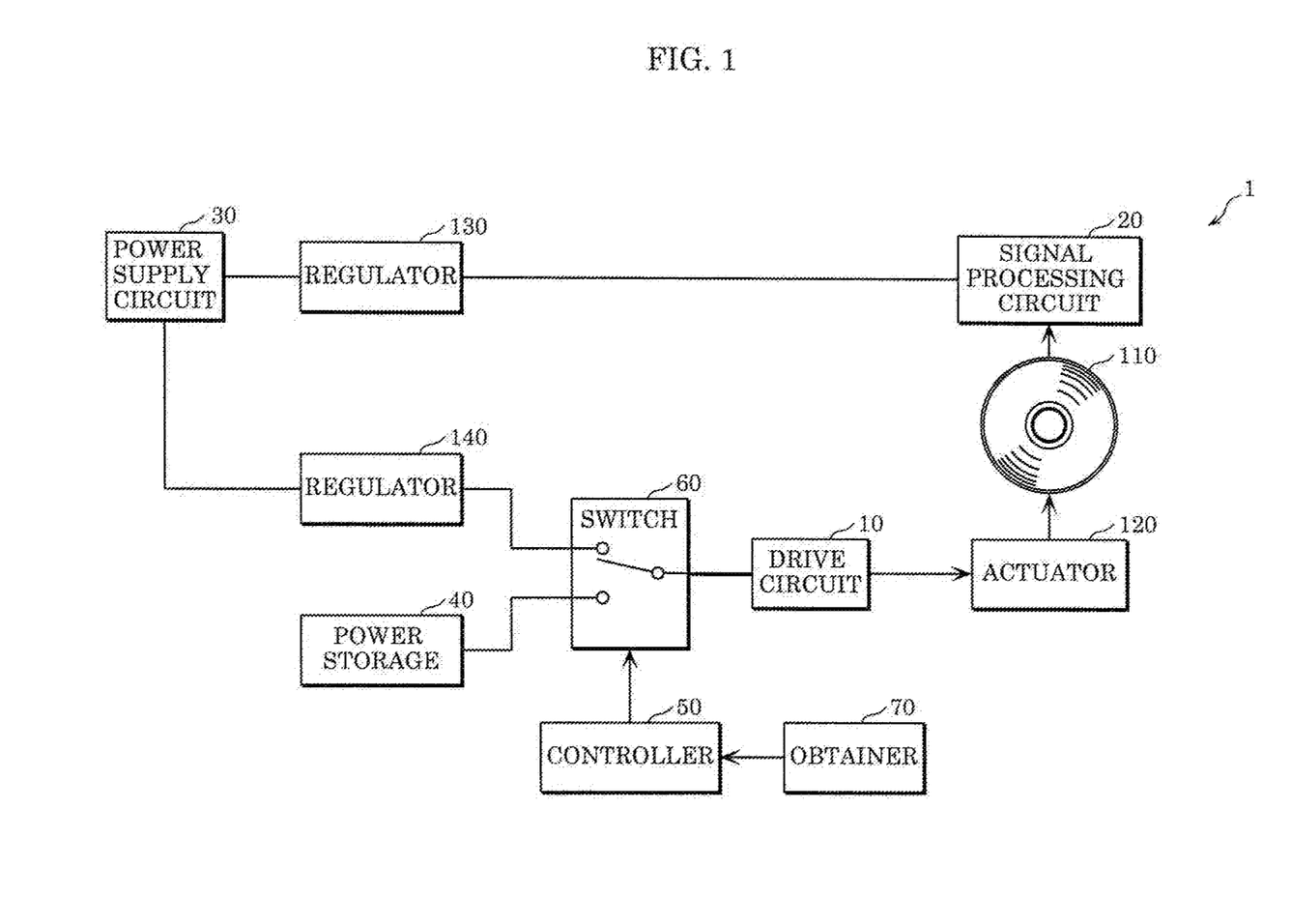
FIG. 1 illustrates an example of the configuration of an audio processing device according to Embodiment 1.

FIG. 1 illustrates an example of the configuration of audio processing device 1 according to Embodiment 1.

Audio processing device 1 is a device for reproducing a music source (audio signals) recorded on recording medium 110, such as a CD, SACD, DVD, and BD. Audio processing device 1 includes drive circuit 10, signal processing circuit 20, power supply circuit 30, power storage 40, controller 50, switch 60, obtainer 70, actuator 120, and regulators 130 and 140. Although not illustrated in the figure, audio processing device 1 includes an optical pickup controlled by actuator 120 (more specifically, by a servomechanism included in actuator 120, this will be described in detail later). The optical pickup includes, for example, a laser source for applying a laser beam to recording medium 110 (optical disc) and a light receiving component for receiving return light from an optical disc and from an optical system such as a lens where the laser beam passes through.

Power supply circuit 30 is a circuit that supplies, to at least signal processing circuit 20, power input from an external power source such as an alternating-current (AC) power source or a direct-current (DC) power source. The power outputted from power supply circuit 30 is stabilized by regulator 130. With this, DC power having a constant voltage is supplied to signal processing circuit 20. Furthermore, the power outputted from power supply circuit 30 is stabilized by regulator 140. With this, DC power having a constant voltage is supplied to drive circuit 10. "Power supply circuit 30 supplies power to at least signal processing circuit 20" means, for example, supplying power to also drive circuit 10 when necessary, while supplying power to signal processing circuit 20.

Regulator 130 is a circuit that generates DC power having a constant voltage, and generates a constant voltage that is necessary for operations of signal processing circuit 20. Regulator 140 is a circuit that generates DC power having a constant voltage, and generates a constant voltage that is necessary for operations of drive circuit 10.

Power storage 40 is a battery for supplying stored power to drive circuit 10. More specifically, power storage 40 includes an electric double-layer capacitor (supercapacitor). An electric double-layer capacitor is better than other capacitors in terms of size, safety, and storage capacity. Power storage 40 supplies power to drive circuit 10 when necessary. In other words, there is a time when power storage 40 does not supply power to drive circuit 10. The current that can be supplied from power storage 40 increases as the size (capacity) of power storage 40 increases. On the other hand, reducing the size of power storage 40 is demanded, and thus increasing the size of power storage 40 is against such a demand. Accordingly, the size of power storage 40 is reduced, and this consequently reduces the current that can be supplied from power storage 40 compared with the current that can be supplied from power supply circuit 30. For example, power storage 40 is electrically insulated from power supply circuit 30 when power storage 40 supplies power to drive circuit 10.

Drive circuit 10 is a circuit that drives actuator 120. Actuator 120 controls an optical pickup for use in obtaining an audio signal from recording medium 110. More specifically, actuator 120 includes a spindle motor and a servomechanism. The spindle motor is controlled by drive circuit 10 and the optical pickup is controlled via the servomechanism. The spindle motor has a function of spinning an optical disc such as an SACD at a predetermined speed. The servomechanism has functions of causing the optical pickup to follow a record track of an optical disc, and controlling the focus of the lens of the optical pickup. These functions enable signal processing circuit 20 to obtain, via the optical pickup, information recorded on an optical disc.

For example, drive circuit 10 needs larger current to cause actuator 120 to, for example, start reproducing, stop reproducing, or skip audio, compared with when causing actuator 120 to continue reproducing audio (for example, during reproduction of audio). Operations such as spinning an optical disc that is stopped and stopping an optical disc that is spinning need large current. In contrast, operations such as causing the optical pickup to follow record tracks of an optical disc during spinning (reproduction) of audio do not need much current. For example, the size of power storage 40 needs to be increased to allow power storage 40 to supply large current necessary to cause actuator 120 to perform operations such as starting reproduction, stopping reproduction, or skipping of audio. However, in the present embodiment, the size of power storage 40 is reduced to meet the demand of reducing the size of power storage 40 as described above, and does not have a capability to supply such large current.

When power supply circuit 30 supplies power to both of signal processing circuit 20 and drive circuit 10, signal processing circuit 20 is electrically connected to drive circuit 10 via power supply circuit 30. Thus, noise in drive circuit 10 that occurs due to change in current when drive circuit 10 controls actuator 120 also affects signal processing circuit 20. When signal processing circuit 20 is affected by the noise, this results in degradation in audio quality. On the other hand, when power supply circuit 30 supplies power to only signal processing circuit 20 and power storage 40 supplies power to only drive circuit 10, power storage 40 is electrically insulated from power supply circuit 30 as described above. Signal processing circuit 20 is electrically insulated from drive circuit 10 by electrically insulating the power supply of signal processing circuit 20 from the power supply of drive circuit 10, and thus the noise is less likely to affect signal processing circuit 20. Note that audio is not reproduced at a time of starting reproduction, stopping reproduction, or skipping of audio. Thus, even when signal processing circuit 20 is affected by the noise, this is less likely to be a problem.

Switch 60 has, for example, a common terminal and two selection terminals that are selectively connected to the common terminal. The common terminal is connected to drive circuit 10, one of the two selection terminals is connected to regulator 140, and the other selection terminal is connected to power storage 40. Such a connection relationship enables switch 60 to selectively switch connection of drive circuit 10 between power storage 40 and regulator 140. Note that power supply circuit 30 is connected to one of the selection terminals of switch 60 via regulator 140, and thus switch 60 is also a switch that selectively switches connection of drive circuit 10 between power storage 40 and power supply circuit 30. Examples of switch 60 include a metal-oxide-semiconductor field-effect transistor (MOSFET) and a diode switch. Switch 60 switches between i) connection of power storage 40 and drive circuit 10, and ii) connection of power supply circuit 30 and drive circuit 10 in accordance with a control signal from controller 50. When power supply circuit 30 and drive circuit 10 are electrically connected to each other by switch 60, power storage 40 is electrically insulated from power supply circuit 30 and drive circuit 10. When power storage 40 and drive circuit 10 are electrically connected to each other by switch 60, power supply circuit 30 is insulated from power storage 40 and drive circuit 10.

When drive circuit 10 is to be in a first state, controller 50 causes switch 60 to connect drive circuit 10 and power supply circuit 30. In other words, when drive circuit 10 is to be in the first state, controller 50 performs control such that power is supplied from power supply circuit 30 to drive circuit 10, and not supplied from power storage 40 to drive circuit 10. Note that "when drive circuit 10 is to be in the first state" means, for example, "when drive circuit 10 will be in the first state in a near future" and means that drive circuit 10 is not in the first state at present. Moreover, when drive circuit 10 enters a second state, controller 50 causes switch 60 to connect drive circuit 10 and power storage 40. In other words, when drive circuit 10 is in the second state, controller 50 performs control such that power is supplied from power storage 40 to drive circuit 10, and not supplied from power supply circuit 30 to drive circuit 10. Note that when drive circuit 10 enters the second state, drive circuit 10 is actually in the second state.

The first state is a state in which the current consumption of drive circuit 10 is greater than or equal to a predetermined threshold. More specifically, the first state is in which actuator 120 is driven to start reproducing, stop reproducing, or skip audio. Furthermore, the second state is a state in which the current consumption of drive circuit 10 is less than the predetermined threshold. More specifically, the second state is in which actuator 120 is driven to continue reproducing audio. In other words, the consumption current greater than or equal to the predetermined threshold is consumption current necessary to cause actuator 120 to start reproducing, stop reproducing, or skip audio. The consumption current less than the predetermined threshold is consumption current necessary to cause actuator 120 to continue reproducing audio.

For example, when the state of drive circuit 10 is to be changed from the second state to the first state, switch 60 is switched before drive circuit 10 enters the first state and the power is supplied from power supply circuit 30 to drive circuit 10. Furthermore, for example, when the state of drive circuit 10 is to be changed from the first state to the second state, switch 60 is switched after drive circuit 10 enters the second state, and the power is supplied from power storage 40 to drive circuit 10. This is because the first state is a state in which the current consumption of drive circuit 10 is greater than or equal to the predetermined threshold. Thus, it is too late if drive circuit 10 is connected to power supply circuit 30 after the state of drive circuit 10 is changed to the first state from the second state, and it is too early if power supply circuit 30 is disconnected from drive circuit 10 before the state of drive circuit 10 is changed from the first state to the second state.

Obtainer 70 obtains an instruction signal indicating starting reproduction, stopping reproduction, or skipping of audio. For example, obtainer 70 obtains the instruction signal when a user operates a remote controller for operating audio equipment etc. equipped with audio processing device 1, or operates a button provided to the audio equipment. For example, when a user operates a start reproducing button, stop reproducing button, or a skip button provided on the audio equipment or the remote controller, obtainer 70 obtains an instruction signal indicating starting reproduction, stopping reproduction, or skipping of audio. Then, when obtainer 70 obtaining such an instruction signal, controller 50 determines that drive circuit 10 is to be in a first state and causes switch 60 to connect drive circuit 10 and power supply circuit 30. When the instruction signal is a specific signal, controller 50 determines that drive circuit 10 is to be in the first state (i.e., controller 50 causes switch 60 to connect drive circuit 10 and power supply circuit 30), and then after elapse of a predetermined time, controller 50 determines that drive circuit 10 enters the second state and causes switch 60 to connect drive circuit 10 and power storage 40. Note that this will be described in detail later.

Signal processing circuit 20 is a circuit that receives an audio signal obtained by the optical pickup controlled using actuator 120 and processes the received audio signal. More specifically, when the optical pickup is controlled using actuator 120, the optical pickup emits a laser beam to an optical disc and receives return light. The optical pickup generates an audio signal based on the return light, and the audio signal is inputted from the optical pickup to signal processing circuit 20. The audio signal processed by signal processing circuit 20 is inputted to a digital signal processor (DSP), for example. The DSP performs acoustic processing on the inputted audio signal. For example, the DSP performs acoustic processing such as converting a sample rate of the audio signal and adjusting frequency characteristics. Subsequently, the output from the DSP is converted into an analog signal by D/A converter, and outputted as an analog audio signal to an audio amplifier, for example.

Audio processing device 1 is a computer including a processor (microcomputer, etc.), memory, and other components. The memory is, for example, ROM and RAM, and is capable of recording a control program (computer program) to be executed by the processor. For example, the processor operates in accordance with the control program (computer program), thereby controlling operations of controller 50 and obtainer 70.

Next, operations of audio processing device 1 will be described with reference to FIG. 2.

Figure 2:
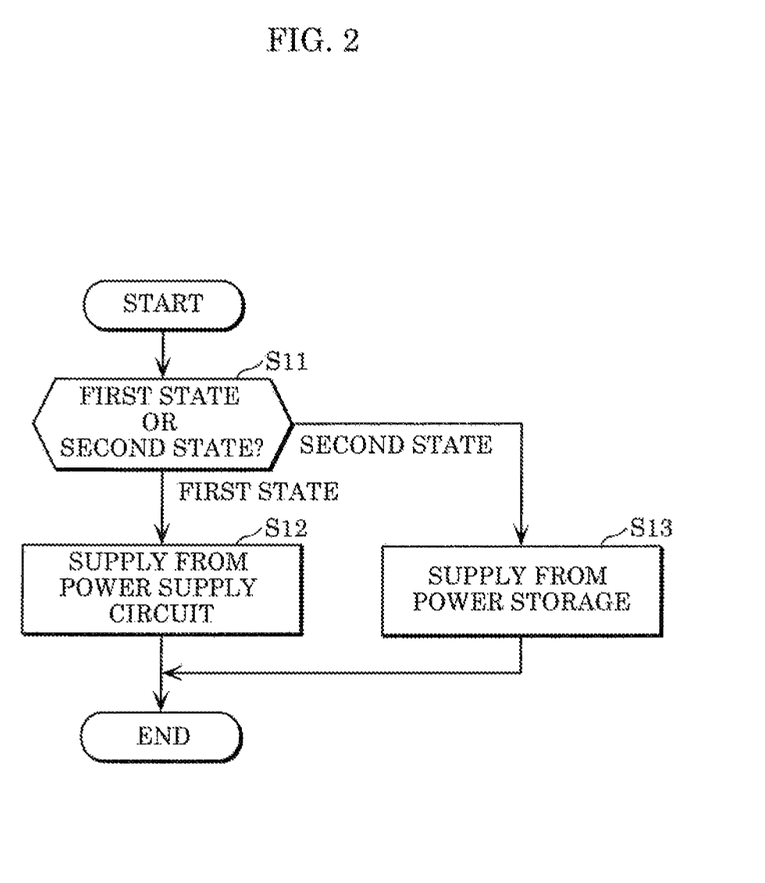
FIG. 2 is a flowchart illustrating an example of operations of the audio processing device according to Embodiment 1.

FIG. 2 is a flowchart illustrating an example of operations of audio processing device 1 according to Embodiment 1.

First, controller 50 determines that drive circuit 10 is to be in the first state or enters the second state (Step S11). As described above, controller 50 determines that drive circuit 10 is to be in the first state in response to obtainer 70 obtaining an instruction signal indicating starting reproduction, stopping reproduction, or skipping of audio.

When controller 50 determines that drive circuit 10 is to be in the first state (the first state in Step S11), controller 50 performs control such that power is supplied from power supply circuit 30 to drive circuit 10, and not supplied from power storage 40 to drive circuit 10 (Step S12). More specifically, when controller 50 determines that drive circuit 10 is to be in the first state, controller 50 switches switch 60 before the state of drive circuit 10 is changed from the second state to the first state, so that power is supplied from power supply circuit 30 to drive circuit 10 and not supplied from power storage 40 to drive circuit 10.

When the instruction signal obtained by obtainer 70 is, for example, a signal indicating starting reproduction or skipping of audio, controller 50 determines that drive circuit 10 is to be in the first state. However, controller 50 determines that drive circuit 10 enters the second state after elapse of a predetermined time from when controller 50 performs such a determination. As described above, large current is needed at a time of starting reproduction or skipping audio. However, after elapse of a predetermined time (for example, two seconds), large current will not be needed because operations such as the spinning of the optical disc are stabilized. Thus, when controller 50 determines that drive circuit 10 enters the second state (the second state in Step S11), controller 50 performs control such that power is supplied from power storage 40 to drive circuit 10 and not supplied from power supply circuit 30 to drive circuit 10 (Step S13). More specifically, when controller 50 determines that drive circuit 10 enters the second state, controller 50 switches switch 60 after the state of drive circuit 10 is changed from the first state to the second state, so that power is supplied from power storage 40 to drive circuit 10 and not supplied from power supply circuit 30 to drive circuit 10. Note that the predetermined time is appropriately determined when the circuit or software of audio processing device 1 is designed.

Moreover, when the instruction signal obtained by obtainer 70 is a signal indicating stopping reproduction of audio, controller 50 determines that drive circuit 10 is to be in the first state. However, controller 50 does not determine that drive circuit 10 enters the second state after elapse of a predetermined time from when controller 50 performs such a determination. In other words, switch 60 is not caused to connect drive circuit 10 and power storage 40 after elapse of the predetermined time from when switch 60 is switched to connect drive circuit 10 and power supply circuit 30 in response to obtainer 70 obtaining an instruction signal indicating stopping reproduction of audio. For example, controller 50 allows switch 60 to maintain the connection between drive circuit 10 and power supply circuit 30 until obtainer 70 obtains a signal indicating starting reproduction of audio and determines that drive circuit 10 enters the second state after elapse of the predetermined time. As described above, large current is needed at a time of stopping reproduction of audio. However, after that, operations such as spinning an optical disc will be stopped and supplying power to drive circuit 10 will not be needed. Thus, drive circuit 10 may be connected to either power storage 40 or power supply circuit 30 as a power supply, and the connection of drive circuit 10 to the power supply does not necessarily need to be switched from power supply circuit 30 to power storage 40. Moreover, after the reproduction of audio is stopped in response to obtainer 70 obtaining an instruction signal indicating stopping reproduction of audio, an operation to be performed next on audio processing device 1 will be starting reproduction of audio. Thus, if the connection to the power supply of drive circuit 10 is switched from power supply circuit 30 to power storage 40 after reproduction of audio is stopped, the power supply of drive circuit 10 needs to be switched again from power storage 40 to power supply circuit 30 after all when obtainer 70 subsequently obtains an instruction signal indicating starting reproduction of audio. Accordingly, when the instruction signal obtained by obtainer 70 is a signal indicating stopping reproduction of audio, controller 50 determines that drive circuit 10 is to be in the first state, and then does not determine that drive circuit 10 enters the second state after elapse of a predetermined time, and does not switch the connection to the power supply of drive circuit 10 from power supply circuit 30 to power storage 40.

As described above, audio processing device 1 includes: drive circuit 10 that drives actuator 120 for use in obtaining an audio signal from recording medium 110; signal processing circuit 20 that processes the audio signal obtained; power supply circuit 30 that supplies, to at least signal processing circuit 20, power inputted from an external source; power storage 40 for supplying stored power to drive circuit 10; switch 60 that selectively switches connection of drive circuit 10 between power storage 40 and power supply circuit 30. Moreover, audio processing device 1 also includes controller 50 that causes switch 60 to connect drive circuit 10 and power supply circuit 30 when drive circuit 10 is to be in a first state, and causes switch 60 to connect drive circuit 10 and power storage 40 when drive circuit 10 enters a second state. The first state is a state in which the current consumption of drive circuit 10 is greater than or equal to a predetermined threshold, and the second state is a state in which the current consumption of drive circuit 10 is less than the predetermined threshold.

With this, for example, during reproduction of audio, such as when drive circuit 10 enters the second state in which the current consumption of drive circuit 10 is less than the threshold even though the current changes due to control by actuator 120, drive circuit 10 receives power supplied from power storage 40 that is electrically insulated from power supply circuit 30. Thus, the noise due to the change in current will not affect signal processing circuit 20 which receives power from power supply circuit 30. On the other hand, for example, when drive circuit 10 is to be in the first state in which the consumption current is greater than or equal to the predetermined threshold, such as at a time of starting reproduction, stopping reproduction, or skipping of audio, drive circuit 10 receives power from power supply circuit 30 which is a common power supply shared with signal processing circuit 20. Note that audio is not reproduced at a time of starting reproduction, stopping reproduction, or skipping of audio. Thus, even when signal processing circuit 20 is affected by noise due to the change in current, this will not be a problem. Accordingly, with audio processing device 1 according to the present disclosure, drive circuit 10 that drives actuator 120 receives power from power storage 40 that is electrically insulated from power supply circuit 30 (signal processing circuit 20) during reproduction of audio, etc. Thus, degradation in audio quality is suppressed.

Meanwhile, in order to eliminate control of switching connection of the power supply of drive circuit 10, power can be supplied from power storage 40 to drive circuit 10 regardless of the first state or the second state. In other words, power supply circuit 30 can be used as a dedicated power supply of signal processing circuit 20, and power storage 40 can be used as a dedicated power supply of drive circuit 10. However, a certain degree of large current will be needed to drive actuator 120 to start reproducing, stop reproducing, or skip audio. In order to enable power storage 40 to supply such large current, increasing the capacity of power storage 40, i.e., increasing the size of power storage 40, is needed. However, large current is necessary only at a limited time such as when starting reproduction, stopping reproduction, or skipping of audio is performed. Increasing the size of power storage 40 only for such a limited time is not advantageous in terms of size and cost. In contrast, with audio processing device 1 according to the present disclosure, power is supplied from power storage 40 to drive circuit 10 only when the consumption current is less than the predetermined threshold, for example, during reproduction of audio. Thus, degradation in audio quality is suppressed while reduction in size of power storage 40 is achieved.

Furthermore, for example, the first state may be a state in which actuator 120 is driven to start reproducing, stop reproducing, or skip audio. The second state may be a state in which actuator 120 is driven to continue reproducing audio.

With this, when large current is needed, for example, at a time of starting reproduction, stopping reproduction, or skipping of audio, power can be supplied to drive circuit 10 from power supply circuit 30, which is capable of supplying large current. When large current is not needed but noise due to change in current may occur, for example, when reproduction of audio is continued (e.g. during reproduction of audio), power can be supplied to drive circuit 10 from power storage 40, which is electrically insulated from power supply circuit 30 (signal processing circuit 20).

Moreover, for example, audio processing device 1 may further include obtainer 70 that obtains an instruction signal indicating starting reproduction, stopping reproduction, or skipping of audio. It is possible that drive circuit 10 is to be in the first state in response to obtainer 70 obtaining the instruction signal.

With this, controller 50 can easily determine whether drive circuit 10 is to be in the first state based on whether the instruction signal is obtained.

Moreover, for example, controller 50 may cause switch 60 to connect drive circuit 10 and power storage 40 after elapse of a predetermined time from when controller 50 causes switch 60 to connect drive circuit 10 and power supply circuit 30 in response to obtainer 70 obtaining an instruction signal indicating starting reproduction or skipping of audio. Moreover, controller 50 does not need to cause switch 60 to connect drive circuit 10 and power storage 40 after elapse of the predetermined time from when controller 50 causes switch 60 to connect drive circuit 10 and power supply circuit 30 in response to obtainer 70 obtaining an instruction signal indicating stopping of audio.

With this, after the reproduction of audio is stopped in response to obtainer 70 obtaining the instruction signal indicating stopping reproduction of audio, an operation to be performed next on audio processing device 1 will be starting reproduction of audio. Thus, if the connection to the power supply of drive circuit 10 is switched from power supply circuit 30 to power storage 40 after reproduction of audio is stopped, the power supply of drive circuit 10 needs to be switched again from power storage 40 to power supply circuit 30 after all when obtainer 70 subsequently obtains an instruction signal indicating starting reproduction of audio. In the present embodiment, connection to the power supply of drive circuit 10 is not switched when obtainer 70 obtains the instruction signal indicating stopping reproduction of audio. Thus, the processing amount and the power consumption of controller 50 (microcomputer, etc.) is reduced.

Embodiment 2

Hereinafter, Embodiment 2 will be described with reference to FIG. 3.

Figure 3:
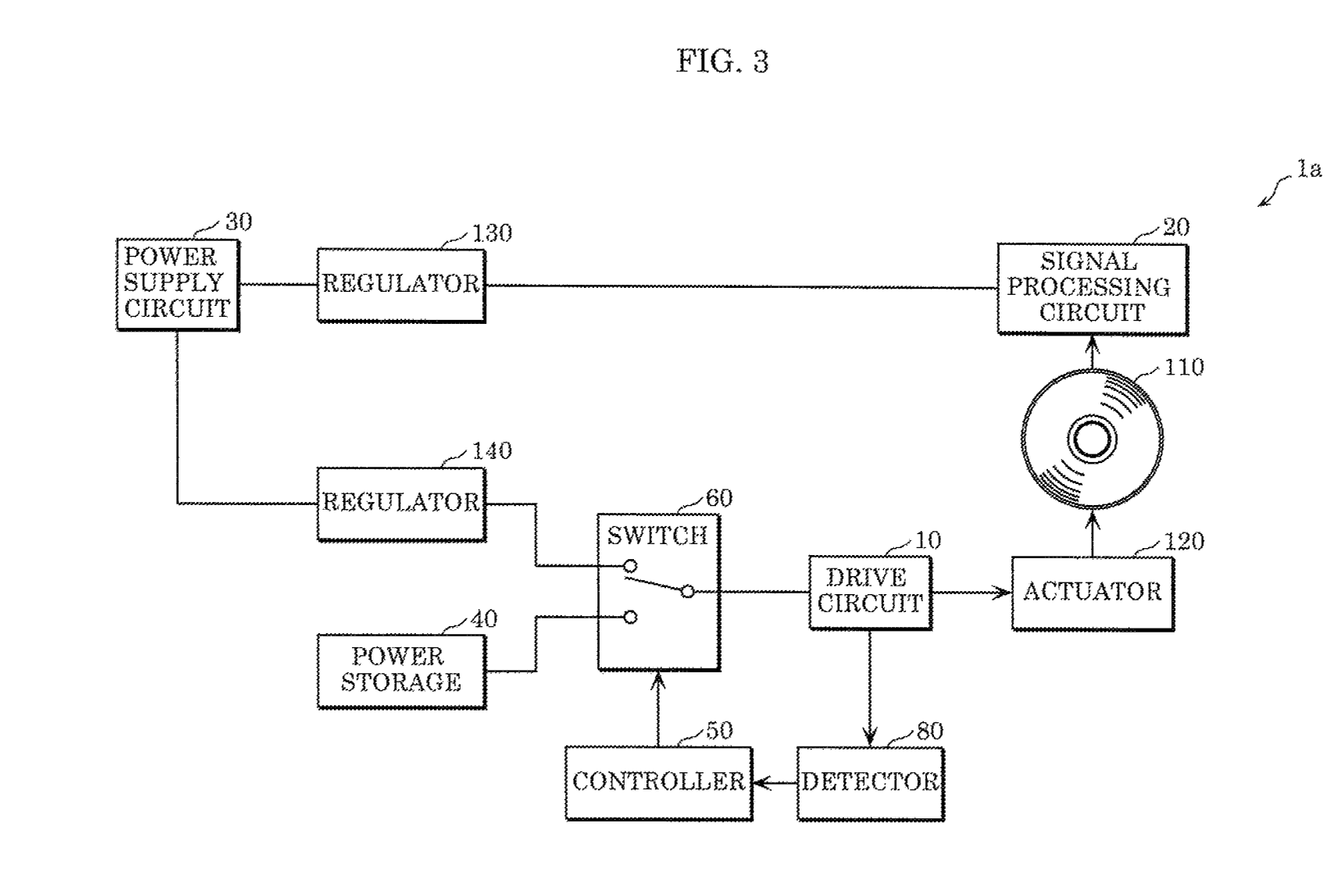
FIG. 3 illustrates an example of the configuration of an audio processing device according to Embodiment 2.

FIG. 3 illustrates an example of the configuration of audio processing device 1a according to Embodiment 2. Audio processing device 1a according to Embodiment 2 differs from audio processing device 1 according to Embodiment 1 in that detector 80 is included instead of obtainer 70. Other than the above, audio processing device 1a is the same as audio processing device 1 according to Embodiment 1, and thus its description will be omitted. The following mainly describes detector 80.

Detector 80 detects the current consumption of drive circuit 10. For example, detector 80 includes a current detecting resistor and an analog/digital (A/D) converter circuit (for example, microcomputer). The current detecting resistor can detect the current consumption of drive circuit 10 by generating a voltage in accordance with the current consumption of drive circuit 10 and inputting the voltage to the A/D converter circuit. Note that controller 50 and the A/D converter circuit of detector 80 may be implemented using the same microcomputer.

When detector 80 detects current greater than or equal to the predetermined threshold, controller 50 determines that drive circuit 10 is to be in the first state and causes switch 60 to connect drive circuit 10 and power supply circuit 30. Moreover, when detector 80 detects current less than the predetermined threshold, controller 50 determines that drive circuit 10 enters the second state and causes switch 60 to connect drive circuit 10 and power storage 40. In other words, in Embodiment 1, when obtainer 70 obtains an instruction signal, the current consumption of drive circuit 10 is estimated to be greater than or equal to the predetermined threshold and the power supply of drive circuit 10 is switched. In Embodiment 2, detector 80 detects actual current consumption of drive circuit 10 and the power supply of drive circuit 10 is switched based on whether the current consumption of drive circuit 10 is actually greater than or equal to the predetermined threshold.

As described above, audio processing device 1a may include detector 80 that detects the current consumption of drive circuit 10. Controller 50 may cause switch 60 to connect drive circuit 10 and power supply circuit 30 when detector 80 detects current greater than or equal to the predetermined threshold, and may cause switch 60 to connect drive circuit 10 and power storage 40 when detector 80 detects current less than the predetermined threshold.

This enables controller 50 to determine whether drive circuit 10 is to be in the first state or enters the second state based on the actual current consumption of drive circuit 10.

Other Embodiments

As described above, Embodiment 1 and Embodiment 2 have been given as examples of the techniques disclosed in the present application. However, the techniques disclosed in the present disclosure are not limited to these embodiments, and are also applicable to embodiments as a result of appropriate modification, replacement, addition, and omission, for instance. Moreover, the structural elements described in each of the embodiments may be combined to create a new embodiment.

For example, power storage 40 may include a plurality of power storage elements (electric double-layer capacitors, etc.). For example, while power is supplied from one of the power storage elements to drive circuit 10, other power storage elements may be charged. This prevents power storage 40 from using up the power stored in power storage 40 and entering a state in which the power cannot be supplied to drive circuit 10. Note that power storage 40 may include a single power storage element. In this case, while power is supplied from the single power storage element to drive circuit 10, the single power storage element may be charged at the same time.

Moreover, not limited to an electric double-layer capacitor, power storage 40 may include a lithium-ion battery, for example.

Moreover, for example, controller 50 may determine whether drive circuit 10 enters the second state in accordance with the audio signal obtained by signal processing circuit 20. For example, in response to an instruction to start reproducing audio, an optical disc is started to spin (at this time, drive circuit 10 is in the first state). When the signal obtained from the spinning optical disc is actually information indicating starting outputting audio, controller 50 obtains such information from, for example, signal processing circuit 20, and then determines that drive circuit 10 enters the second state. In other words, drive circuit 10 enters the second state after signal processing circuit 20 actually obtains a signal indicating starting outputting audio from the optical disc.

Moreover, the present disclosure is not only implemented as an audio processing device, but also implemented as a method including steps (processes) performed by controller 50 or other structural elements included in the audio processing device.

For example, these steps may be executed by a computer (computer system). The present disclosure can be implemented as a program to cause a computer to execute the steps included in the method. Furthermore, the present disclosure may be implemented as a non-transitory computer-readable recording medium having the program recorded thereon, such as a CD-ROM.

For example, when the present disclosure is implemented as a program (software), each of the steps is executed by executing the program using hardware resources such as a CPU, memory, and an input output circuit of a computer. In other words, each of the steps is executed by the CPU obtaining data from the memory, input and output circuit, or the like, calculating the data and outputting a calculation result to the memory, the input and output circuit, or the like.

Each of the structural elements included in the audio processing device in the above embodiments may be implemented as a dedicated or general-purpose circuit.

Each of the structural elements included in the audio processing device in the above embodiments may be implemented as a large-scale integration (LSI), which is an integrated circuit (IC).

Such an IC is not limited to the LSI, and thus may be implemented as a dedicated circuit or a general-purpose processor. Alternatively, a field programmable gate array (FPGA) that allows programming, or a reconfigurable processor that allows reconfiguration of the connection and the setting of circuit cells inside an LSI may be employed.

Furthermore, when advancement in semiconductor technology or derivatives of other technologies brings forth a circuit integration technology which replaces LSI, it will be appreciated that such a circuit integration technology may be used to integrate the structural elements included in the audio processing device.

As described above, Embodiment 1 and Embodiment 2 have been given as examples of the techniques disclosed in the present disclosure. For such a purpose, the accompanying drawings and the detailed descriptions have been provided.

The structural elements described in the accompanying drawings and the detailed descriptions may therefore include not only essential structural elements for achievement of the object but also structural elements that are not essential to achieve the object and are provided to describe the technology described above. The inclusion of such optional structural elements in the detailed description and the accompanying drawings therefore does not mean that these optional structural elements are essential structural elements.

The foregoing embodiments are intended to be illustrative of the disclosed techniques, and so various changes, replacements, additions, omissions, etc. can be made within the scope of the appended claims and their equivalents.

INDUSTRIAL APPLICABILITY

The present disclosure is applicable to a device that needs to improve degradation in audio quality. More specifically, the present disclosure is applicable to a device that reproduces sound, such as audio equipment, a television, a personal computer (PC), and a mobile device.

The invention claimed is:

1. An audio processing device, comprising:
a drive circuit that drives an actuator for use in obtaining an audio signal from a recording medium;
a signal processing circuit that processes the audio signal obtained;
a power supply circuit that supplies, to at least the signal processing circuit, power inputted from an external source;
a power storage for supplying stored power to the drive circuit;
a switch that selectively switches connection of the drive circuit between the power storage and the power supply circuit; and
a controller that causes the switch to connect the drive circuit and the power supply circuit when the drive circuit is to be in a first state, and
causes the switch to connect the drive circuit and the power storage, electrically insulate the power storage and the power supply circuit from each other, and cause the power supply circuit insulated from the power storage to supply the power to the signal processing circuit when the drive circuit enters a second state, wherein
the first state is a state in which current consumption necessary for driving the drive circuit is greater than or equal to a predetermined threshold, and
the second state is a state in which the current consumption necessary for driving the drive circuit is less than the predetermined threshold.

2. The audio processing device according to claim 1, wherein
the first state is a state in which the actuator is driven to start reproducing, stop reproducing, or skip audio, and
the second state is a state in which the actuator is driven to continue reproducing audio.

3. The audio processing device according to claim 1, further comprising:
an obtainer that obtains an instruction signal indicating starting reproduction, stopping reproduction, or skipping of audio, wherein
the drive circuit is to be in the first state in response to the obtainer obtaining the instruction signal.

4. The audio processing device according to claim 3, wherein
the controller:
causes the switch to connect the drive circuit and the power storage after elapse of a predetermined time from when the controller causes the switch to connect the drive circuit and the power supply circuit in response to the obtainer obtaining an instruction signal indicating starting reproduction or skipping of audio; and
does not cause the switch to connect the drive circuit and the power storage after elapse of the predetermined time from when the controller causes the switch to connect the drive circuit and the power supply circuit in response to the obtainer obtaining an instruction signal indicating stopping of audio.

5. The audio processing device according to claim 1, further comprising:
a detector that detects the current consumption of the drive circuit, wherein
the controller:
causes the switch to connect the drive circuit and the power supply circuit when the detector detects current greater than or equal to the predetermined threshold; and
causes the switch to connect the drive circuit and the power storage when the detector detects current less than the predetermined threshold.

6. An audio processing device, comprising:
a drive circuit that drives an actuator for use in obtaining an audio signal from a recording medium;
a signal processing circuit that processes the audio signal obtained;
a power supply circuit that supplies, to at least the signal processing circuit, power inputted from an external source;
a power storage for supplying stored power to the drive circuit;
a switch that selectively switches connection of the drive circuit between the power storage and the power supply circuit; and
a controller that causes the switch to connect the drive circuit and the power supply circuit when the drive circuit is to be in a first state, and causes the switch to connect the drive circuit and the power storage when the drive circuit enters a second state, wherein
the first state is a state in which current consumption of the drive circuit is greater than or equal to a predetermined threshold and the actuator is driven to start reproducing, stop reproducing, or skip audio, and the second state is a state in which the current consumption of the drive circuit is less than the predetermined threshold and the actuator is driven to continue reproducing audio.

7. An audio processing device, comprising:

a drive circuit that drives an actuator for use in obtaining an audio signal from a recording medium;

a signal processing circuit that processes the audio signal obtained;

a power supply circuit that supplies, to at least the signal processing circuit, power inputted from an external source;

a power storage for supplying stored power to the drive circuit;

a switch that selectively switches connection of the drive circuit between the power storage and the power supply circuit; a controller that causes the switch to connect the drive circuit and the power supply circuit when the drive circuit is to be in a first state, and causes the switch to connect the drive circuit and the power storage when the drive circuit enters a second state; and an obtainer that obtains an instruction signal indicating starting reproduction, stopping reproduction, or skipping of audio, wherein the first state is a state in which current consumption of the drive circuit is greater than or equal to a predetermined threshold, the second state is a state in which the current consumption of the drive circuit is less than the predetermined threshold, and the drive circuit is to be in the first state in response to the obtainer obtaining the instruction signal.

8. An audio processing device, comprising:

a drive circuit that drives an actuator for use in obtaining an audio signal from a recording medium;

a signal processing circuit that processes the audio signal obtained;

a power supply circuit that supplies, to at least the signal processing circuit, power inputted from an external source;

a power storage for supplying stored power to the drive circuit;

a switch that selectively switches connection of the drive circuit between the power storage and the power supply circuit;

a controller that causes the switch to connect the drive circuit and the power supply circuit when the drive circuit is to be in a first state, and causes the switch to connect the drive circuit and the power storage when the drive circuit enters a second state; and an obtainer that obtains an instruction signal indicating starting reproduction, stopping reproduction, or skipping of audio, wherein the first state is a state in which current consumption of the drive circuit is greater than or equal to a predetermined threshold, the second state is a state in which the current consumption of the drive circuit is less than the predetermined threshold, the drive circuit is to be in the first state in response to the obtainer obtaining the instruction signal, and the controller:
  causes the switch to connect the drive circuit and the power storage after elapse of a predetermined time from when the controller causes the switch to connect the drive circuit and the power supply circuit in response to the obtainer obtaining an instruction signal indicating starting reproduction or skipping of audio; and
  does not cause the switch to connect the drive circuit and the power storage after elapse of the predetermined time from when the controller causes the switch to connect the drive circuit and the power supply circuit in response to the obtainer obtaining an instruction signal indicating stopping of audio.

* * * * *